(12) United States Patent
Nishitani et al.

(10) Patent No.: US 11,150,204 B2
(45) Date of Patent: Oct. 19, 2021

(54) SAMPLE INSPECTION DEVICE AND SAMPLE INSPECTION METHOD

(71) Applicant: PHOTO ELECTRON SOUL INC., Nagoya (JP)

(72) Inventors: Tomohiro Nishitani, Nagoya (JP); Atsushi Koizumi, Nagoya (JP); Haruka Shikano, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 0 days.

(21) Appl. No.: 16/609,728

(22) PCT Filed: Dec. 20, 2018

(86) PCT No.: PCT/JP2018/046926
§ 371 (c)(1),
(2) Date: Oct. 30, 2019

(87) PCT Pub. No.: WO2019/131410
PCT Pub. Date: Jul. 4, 2019

(65) Prior Publication Data
US 2020/0080949 A1  Mar. 12, 2020

(30) Foreign Application Priority Data

Dec. 27, 2017 (JP) .............................. JP2017-252709

(51) Int. Cl.
*G01N 23/2251* (2018.01)
*H01J 37/073* (2006.01)
(Continued)

(52) U.S. Cl.
CPC ........ *G01N 23/2251* (2013.01); *H01J 37/073* (2013.01); *H01J 37/244* (2013.01); *H01J 37/222* (2013.01); *H01J 37/252* (2013.01)

(58) Field of Classification Search
USPC ...................................... 250/492.3
See application file for complete search history.

(56) References Cited

U.S. PATENT DOCUMENTS

| 4,909,628 A | * | 3/1990 | Aoshima | .................. G01J 9/04 |
| | | | | 250/214 VT |
| 5,041,724 A | | 8/1991 | Feuerbaum | |

(Continued)

FOREIGN PATENT DOCUMENTS

| EP | 0873573 A2 | 10/1998 |
| EP | 1511066 A2 | 6/2004 |

(Continued)

OTHER PUBLICATIONS

Korean Office Action dated Sep. 29, 2020 for corresponding Korean application No. 10-2019-7031879 with English translation, pp. 1-8.

(Continued)

*Primary Examiner* — Phillip A Johnston
(74) *Attorney, Agent, or Firm* — Intellectual Property Law Group LLP

(57) ABSTRACT

The present invention addresses the problem of providing a sample inspection device and a sample inspection method, whereby noise is removed from a detection signal, and a generated electron beam is utilized effectively for inspection. A sample inspection device according to the present invention is provided with a light source for emitting frequency-modulated light, a photocathode for emitting an electron beam in response to receiving the frequency-modulated light, a detector for detecting electrons emitted from a sample irradiated by the electron beam and generating a detection signal, and a signal extractor for extracting a signal having a frequency corresponding to a modulation frequency of the frequency-modulated light from within the detection signal.

15 Claims, 6 Drawing Sheets

(51) Int. Cl.
*H01J 37/244* (2006.01)
*H01J 37/22* (2006.01)
*H01J 37/252* (2006.01)

(56) References Cited

U.S. PATENT DOCUMENTS

| | | | | |
|---|---|---|---|---|
| 5,043,568 | A * | 8/1991 | Tsuchiya | H04N 5/30 250/214 VT |
| 5,179,565 | A * | 1/1993 | Tsuchiya | G01R 15/22 372/26 |
| 5,281,909 | A | 1/1994 | Brust | |
| 6,724,002 | B2 * | 4/2004 | Mankos | B82Y 10/00 250/492.2 |
| 7,068,363 | B2 * | 6/2006 | Bevis | G01N 21/474 356/237.5 |
| 7,446,474 | B2 * | 11/2008 | Maldonado | B82Y 10/00 313/541 |
| 2003/0085353 | A1 * | 5/2003 | Almogy | H01J 37/28 250/310 |
| 2009/0101817 | A1 | 4/2009 | Ohshima et al. | |

FOREIGN PATENT DOCUMENTS

| | | |
|---|---|---|
| JP | S61184445 A | 8/1986 |
| JP | S63266754 A | 11/1988 |
| JP | 1999509360 A | 8/1990 |
| JP | H 09298032 A | 11/1997 |
| JP | 2003303565 A | 10/2003 |
| JP | 2005071775 A | 3/2005 |
| JP | 2009099468 A | 5/2009 |
| JP | 2014092514 A | 5/2014 |
| JP | WO2017/168554 A1 | 10/2017 |
| WO | WO 9703453 | 1/1997 |

OTHER PUBLICATIONS

International Search Report, dated Mar. 26, 2019 for corresponding International Application No. PCT/JP2018/046926 with English translation.
Written Opinion of the ISA, dated Mar. 26, 2019 for corresponding International Application No. PCT/JP2018/046926 with English translation.
Extended European Search Report dated Mar. 10, 2021 for corresponding European application No. 18897698.9, pp. 1-7.

* cited by examiner

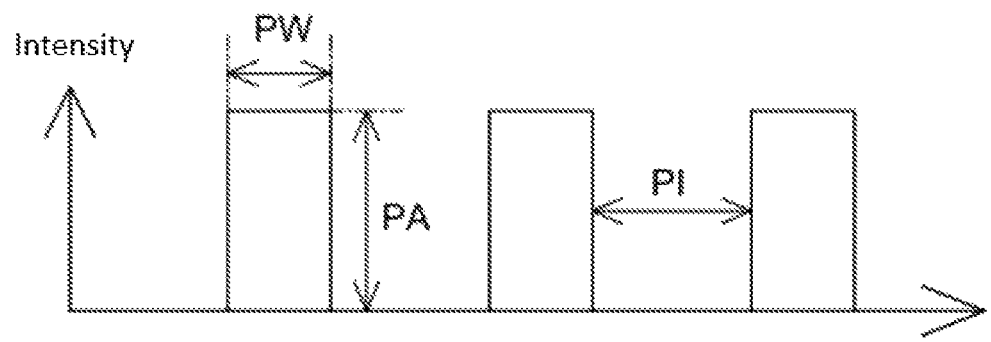
FIG. 4A
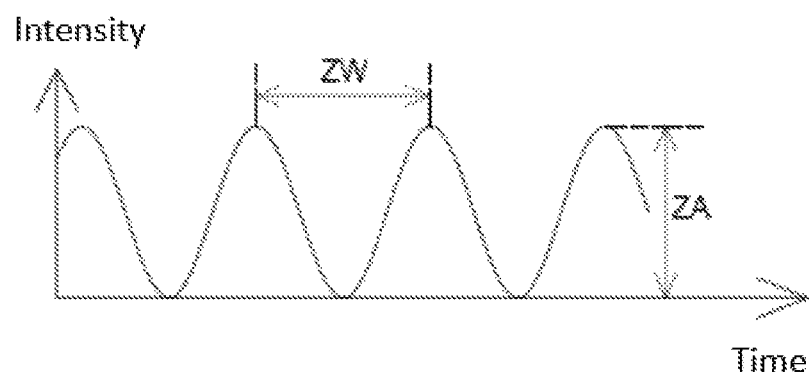
FIG. 4B
| Sample type | Control parameter value | | |
|---|---|---|---|
| | Pulse amplitude | Pulse width | Pulse interval |
| T1 | VA1 | VW1 | VI1 |
| T2 | VA2 | VW2 | VI2 |
DA
FIG. 5

SAMPLE INSPECTION DEVICE AND SAMPLE INSPECTION METHOD

CROSS-REFERENCE TO RELATED APPLICATIONS

This application is a U.S. National Phase application, under 35 U.S.C. § 371, of International Application no. PCT/JP2018/046926, with an international filing date of Dec. 20, 2018, and claims priority to Japanese application no. 2017-252709, filed on Dec. 27, 2017, each of which is hereby incorporated by reference for all purposes.

TECHNICAL FIELD

The present invention relates to a sample inspection device and a sample inspection method, and relates particularly to a sample inspection device for inspecting a sample using an electron beam emitted from a photocathode, and to a sample inspection method.

TECHNICAL BACKGROUND

A sample inspection device for inspecting a sample using light or an electron ray (electron beam) is known.

As a related art, Patent Document 1 discloses an absorption current image observation apparatus in an electron microscope. The observation apparatus disclosed in Patent Document 1 is provided with a means for modulating an electron ray by a predetermined frequency, a means for radiating the modulated electron ray to a sample, and a means for measuring a modulation frequency component of an electric current excited in the sample by the radiated electron ray.

In the absorption current image observation apparatus in an electron microscope disclosed in Patent Document 1, a pulsed voltage is applied to a blanking electrode. A portion of the electron ray receives the pulsed voltage and is bent. The bent electron ray cannot pass through a blanking slit. As a result, the electron ray passing through the blanking slit becomes a pulsed electron ray.

When the absorption current image observation apparatus in an electron microscope disclosed in Patent Document 1 is used, an absorption current signal absorbed by the sample becomes a signal centered about a blanking frequency of the electron ray. In the absorption current image observation apparatus in an electron microscope disclosed in Patent Document 1, noise can be reduced through use of a band-pass filter corresponding to the blanking frequency.

Patent Document 2 discloses a semiconductor device inspection apparatus. The semiconductor device inspection apparatus disclosed in Patent Document 2 is provided with: a laser light source for emitting light; a light sensor for detecting reflected light of the aforementioned light, reflected by a semiconductor device, and outputting a detection signal; a frequency band setting unit for setting a measurement frequency band and a reference frequency band with respect to the detection signal; a spectrum analyzer for generating a measurement signal and a reference signal from the detection signal in the measurement frequency band and the reference frequency band; and a signal acquisition unit for acquiring an analysis signal by calculating a difference between the measurement signal and the reference signal. A lock-in method (means for enhancing S/N by acquiring a frequency synchronized with a signal pulse train) is also used in the semiconductor device inspection apparatus disclosed in Patent Document 2.

PRIOR ARTS LIST

Patent Document 1: Japanese Laid-open Patent Publication No. 2005-71775
Patent Document 2: Japanese Laid-open Patent Publication No. 2014-92514

SUMMARY OF THE INVENTION

Problems to be Solved by the Invention

In the absorption current image observation apparatus in an electron microscope disclosed in Patent Document 1, a pulsed electron ray is formed by actively eliminating a portion of an electron ray using the blanking electrode. An unnecessary electron ray that does not contribute to sample inspection therefore occurs, and an additional device (a blanking electrode, blanking slit, or the like) for creating the unnecessary electron ray is therefore required.

The semiconductor device inspection apparatus disclosed in Patent Document 2 is an apparatus for inspecting a semiconductor device by irradiating a semiconductor device with light. When a sample is inspected using light, an inspection spot diameter (spot diameter of light) is larger than when a sample is inspected using an electron ray. It is therefore impossible to adequately inspect a fine structure.

In view of the foregoing, an object of the present invention is to provide a sample inspection device and a sample inspection method, whereby noise is removed from a detection signal, and a generated electron beam is utilized effectively for inspection. Any additional effects of the present invention will become clear in embodiments of the invention.

Means to Solve the Problems

The present invention relates to the sample inspection device and the sample inspection method described below.
(1) A sample inspection device, comprising:
a light source for emitting frequency-modulated light;
a photocathode for emitting an electron beam in response to receiving said frequency-modulated light;
a detector for detecting an electron emitted from a sample irradiated by said electron beam and generating a detection signal; and
a signal extractor for extracting a signal having a frequency corresponding to a modulation frequency of said frequency-modulated light from within said detection signal.
(2) The sample inspection device of (1) above, wherein:
said signal extractor includes a lock-in amplifier;
said lock-in amplifier receives said detection signal and a reference signal; and
said lock-in amplifier extracts a signal having a frequency corresponding to a frequency of said reference signal from within said detection signal.
(3) The sample inspection device of (1) or (2) above, further comprising:
a light source control device for controlling operation of said light source in accordance with a control parameter value; and
a storage device for storing first associated data in which a type of said sample and said control parameter value are associated;

said control parameter value including at least one of an amplitude control parameter value or a pulse amplitude control parameter value of said frequency-modulated light, a pulse width control parameter value or a control parameter value for prescribing a time interval between two maximum amplitudes of said frequency-modulated light, a parameter value for prescribing a unit waveform or a parameter value for prescribing a unit pulse waveform of said frequency-modulated light, and a pulse interval control parameter value.

(4) The sample inspection device of (1) or (2) above, further comprising:

a light source control device for controlling operation of said light source;

said light source control device being capable of selectively executing a first control mode for varying a light quantity per unit time of said frequency-modulated light emitted from said light source, and a second control mode for holding constant the light quantity per unit time of said frequency-modulated light emitted from said light source.

(5) A sample inspection method comprising:

a light irradiation step for radiating frequency-modulated light to a photocathode;

an electron beam irradiation step for radiating an electron beam emitted from said photocathode to a sample;

a detection step for detecting, through use of a detector, an electron emitted from said sample; and a signal extraction step for extracting a signal having a frequency corresponding to a modulation frequency of said frequency-modulated light from within a detection signal generated by said detector.

(6) The sample inspection method of (5) above, further comprising:

a step for changing, in accordance with the type of said sample, at least one of an amplitude of said frequency-modulated light or a pulse amplitude of said frequency-modulated light, a time interval between two maximum amplitudes of said frequency-modulated light or a pulse width of said frequency-modulated light, a unit waveform of said frequency-modulated light, and a pulse interval of said frequency-modulated light.

(7) The sample inspection method of (5) above, comprising:

a sample inspection step including said light irradiation step, said electron beam irradiation step, said detection step, and said signal extraction step; and a durability inspection step executed prior to said sample inspection step;

said durability inspection step including inspecting durability of said sample to said electron beam, or inspecting durability of a sample of the same type as said sample to said electron beam; and a control parameter value of a light source used in said sample inspection step being determined in accordance with an inspection result of said durability inspection step.

(8) The sample inspection method of (6) above, comprising:

a sample inspection step including said light irradiation step, said electron beam irradiation step, said detection step, and said signal extraction step; and a durability inspection step executed prior to said sample inspection step;

said durability inspection step including inspecting durability of said sample to said electron beam, or inspecting durability of a sample of the same type as said sample to said electron beam; and a control parameter value of a light source used in said sample inspection step being determined in accordance with an inspection result of said durability inspection step.

(9) The sample inspection method of any one of (5) through (8) above, comprising:

a first layer inspection step for inspecting a first layer of said sample; and a second layer inspection step for inspecting a second layer of said sample after said second layer is layered over said first layer;

each of said first layer inspection step and said second layer inspection step including said light irradiation step, said electron beam irradiation step, said detection step, and said signal extraction step; and said electron beam being radiated to said second layer so that said electron beam does not reach said first layer in said second layer inspection step.

Advantageous Effects of the Invention

The present invention makes it possible to provide a sample inspection device and a sample inspection method, whereby noise is removed from a detection signal and a generated electron beam can be effectively utilized for inspection.

BRIEF DESCRIPTION OF THE DRAWINGS

FIG. 4A is a diagram for describing a pulse amplitude, a pulse width, and a pulse interval;

FIG. 4B is a diagram for describing an amplitude of frequency-modulated light, and a time interval between two maximum amplitudes of the frequency-modulated light;

FIG. 5 is a schematic view illustrating a manner in which a sample type and a plurality of control parameter values are associated and stored;

DESCRIPTION OF THE EMBODIMENTS

A sample inspection device 1 and a sample inspection method according to embodiments of the present invention will be described in detail below with reference to the accompanying drawings. In the present specification, members having the same function are referred to using same or similar reference symbols. Repeated description is also sometimes omitted for members referred to by same or similar reference symbols.

Embodiment 1

Figure 1:
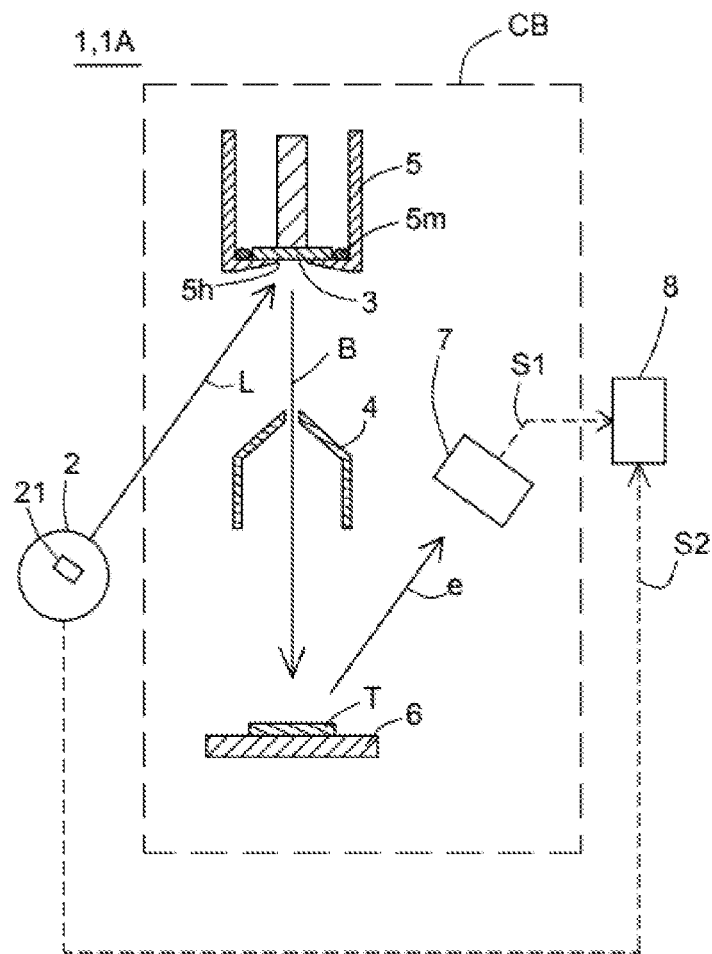
FIG. 1 is a schematic view illustrating a sample inspection device according to a first embodiment.
Figure 2:
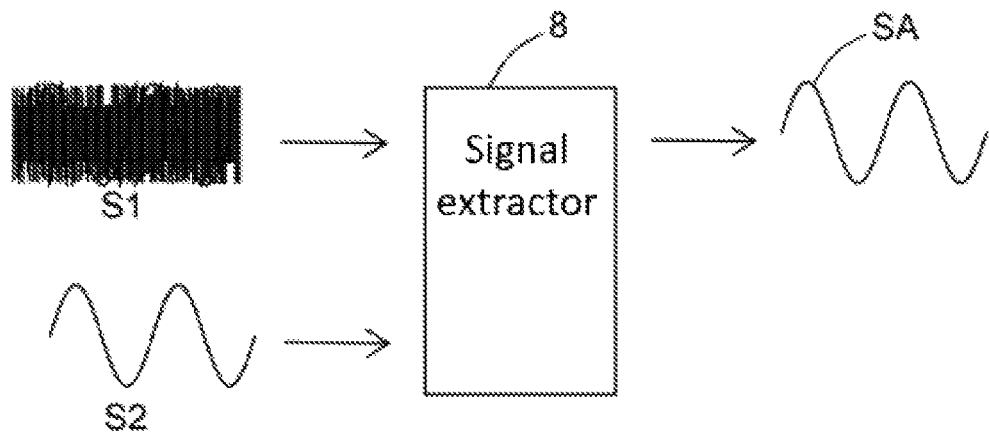
FIG. 2 is a schematic view illustrating a manner in which a signal having a frequency corresponding to a frequency of a reference signal is extracted from within a detection signal.

A sample inspection device 1A according to a first embodiment is described below with reference to FIGS. 1 and 2. FIG. 1 is a schematic view illustrating the sample inspection device 1A according to the first embodiment. FIG. 2 is a schematic view illustrating a manner in which a signal having a frequency corresponding to a frequency of a reference signal S2 is extracted from within a detection signal S1.

The sample inspection device 1A according to the first embodiment is provided with a light source 2, a photocathode 3, a detector 7, and a signal extractor 8.

The light source 2 is a light source for emitting frequency-modulated light, a frequency of which is modulated. An example is described below in which the light source 2 is a pulse light source for emitting pulse light, which is a type of frequency-modulated light. Alternatively, the light source 2 may be a light source for emitting frequency-modulated light other than pulse light (e.g., a light source for emitting frequency-modulated light, an intensity of which varies sinusoidally). In this case, "pulse light" shall be replaced with "frequency-modulated light" in the description below. The term "frequency-modulated light" in the present specification means light having a periodically varying intensity. The term "pulse light" in the present specification means light from among frequency-modulated light in which periods of essentially zero light intensity are periodically present.

In the example illustrated in FIG. 1, the light source 2 is a light source for emitting pulse light L. From the perspective of obtaining high-intensity pulse light, the light source 2 is preferably a laser light source for emitting pulse light L. The light source 2 is a light source for emitting a high-output (watt-class), high-frequency (several hundred MHz), short-pulse (several hundred femtoseconds) laser pulse. Alternatively, the light source 2 may be a relatively inexpensive laser diode, LED, or the like. In the example illustrated in FIG. 1, the light source 2 is disposed outside a vacuum chamber CB. Alternatively, the light source 2 may be disposed inside the vacuum chamber CB.

Any configuration can be adopted for the light source 2. As a first example of the light source 2, a pulse light source using a Q-switch pulse oscillator can be used. In this case, a voltage is applied to an electro-optic element 21 included in the light source 2, and a Q value of the electro-optic element thereby changes. As a result, pulse light synchronized with a timing of voltage application is obtained. As a second example of the light source 2, a light source 2 can be used in which a beam output of a continuous laser is turned ON/OFF by a mechanical shutter (including a so-called optical chopper). Pulse light may be generated from a continuous laser beam using a liquid crystal shutter, an electro-optic modulator, or an acousto-optic modulator instead of a mechanical shutter. As a third example of the light source 2, a semiconductor laser light source can be used. In this case, pulse light is obtained by turning ON/OFF an electric current supplied to a semiconductor element. As a fourth example of the light source 2, a pulse light source which utilizes a mode-lock method can be used.

In the example illustrated in FIG. 1, the photocathode 3 is disposed inside the vacuum chamber CB. The photocathode 3 (more specifically, the semiconductor photocathode) emits an electron beam B (more specifically, a pulsed electron beam) in response to reception of the pulse light L emitted by the light source 2. More specifically, electrons in the photocathode 3 are excited by the pulse light, and excited electrons are emitted from the photocathode 3. The emitted electrons are accelerated by an electric field generated by an anode 4 and a cathode (including the photocathode 3), and an electron beam is formed. In the example illustrated in FIG. 1, the pulse light is radiated from a front surface side of the photocathode 3, but the pulse light may alternatively be radiated from a back surface side of the photocathode 3. In the example illustrated in FIG. 1, the photocathode 3 is disposed inside a photocathode accommodating vessel 5 provided with an electron beam passage hole 5h. A treatment material 5m for EA surface treatment (i.e., treatment for lowering electron affinity) of the photocathode 3 may be disposed inside the photocathode accommodating vessel 5.

There are no particular limitations as to the photocathode material for forming the photocathode 3, and there may be cited, for example, Group III-V semiconductor materials and Group II-VI semiconductor materials. Specifically, AlN, $Ce_2Te$, GaN, $K_2CsSb$, AlAs, GaP, GaAs, GaSb, InAs, and the like, and mixed crystals thereof and the like may be cited. Metals may be cited as another example. Specifically, Mg, Cu, Nb, $LaB_6$, $SeB_6$, Ag, and the like may be cited. The photocathode 3 can be fabricated through EA surface treatment of said photocathode material, and through selection of the structure and material of the semiconductor material for the photocathode 3, it is possible not only to select the electron-excitation light from within a near-ultraviolet to infrared wavelength region depending on the gap energy of the semiconductor, but also to select the electron-beam source capabilities (quantum yield, durability, monochromaticity, temporal response, and spin polarization) depending on the electron beam application.

An electron beam B emitted from the photocathode 3 is incident on a sample T. In the example illustrated in FIG. 1, the sample T is supported by a sample stage 6. The sample T is a wafer, an integrated circuit, NAND-type flash memory, DRAM, or an intermediate product (semi-finished product) thereof, or any electronic material or the like. The sample T may be a battery material, an LED, an LD, a biological sample, organic matter, or another sample susceptible to damage by electron ray irradiation. In the example illustrated in FIG. 1, the sample T and the sample stage 6 are disposed inside the vacuum chamber CB.

Reflected electrons, secondary electrons, transmitted electrons, and other electrons are emitted from the sample T irradiated by the electron beam B. The reflected electrons are electrons that are reflected by the sample T from among the electrons in the electron beam B. The secondary electrons are electrons emitted from inside the sample T due to irradiation of the sample T by the electron beam B. The transmitted electrons are electrons that are transmitted through the sample T from among the electrons in the electron beam B.

The detector 7 detects electrons e such as reflected electrons and secondary electrons emitted from the sample, or transmitted electrons, and generates a detection signal S1. The detector 7 may be a scintillator, a microchannel plate, or any other electron detector, for example. In the example illustrated in FIG. 1, the detector 7 is disposed inside the vacuum chamber CB. A configuration may also be adopted in which an electron detection part of the detector 7 is disposed inside the vacuum chamber CB and any constituent elements other than the electron detection part of the detector 7 are disposed outside the vacuum chamber.

The signal extractor 8 extracts a signal having a frequency corresponding to the pulse frequency of the pulse light L (pulse light emitted from the light source 2) from within a detection signal S1 generated by the detector 7. For example, the signal extractor 8 receives a detection signal S1 from the detector 7, and receives a signal (reference signal S2) corresponding to a pulse waveform of the pulse light from the light source 2. The signal extractor 8 extracts a signal having a frequency corresponding to the frequency of the abovementioned reference signal S2 from the detection signal S1 received from the detector 7. In the case that the light emitted from the light source 2 is light other than pulse light, "pulse frequency" shall be replaced with "modulation frequency" (i.e., the frequency of the change in intensity of the frequency-modulated light). Pulse frequency is also a type of modulation frequency.

A publicly known lock-in amplifier, for example, can be used as the signal extractor 8. The lock-in amplifier receives the detection signal S1 and the reference signal S2, and extracts a signal having a frequency corresponding to the frequency of the reference signal S2 from the detection signal S1. Alternatively, any electronic circuit (e.g., a frequency filter) for extracting a signal having a frequency corresponding to the frequency of the reference signal from within the detection signal generated by the detector 7 may be used as the signal extractor 8. As another alternative, a computer may be used as the signal extractor 8. In this case, the computer extracts a signal having a frequency corresponding to the frequency of the reference signal from within the detection signal using any computer program for extracting a specific frequency component from a signal which includes noise. For example, signal data corresponding to the detection signal generated by the detector 7, and frequency data corresponding to the frequency of the reference signal are inputted to the computer, and the computer converts the abovementioned signal data to data in which a frequency component corresponding to the frequency of the reference signal is emphasized using the abovementioned computer program, and outputs the resultant data.

A control signal (e.g., a voltage signal inputted to the electro-optic element 21 of the light source, a drive signal for driving the mechanical shutter of the light source, an ON/OFF signal inputted to the semiconductor laser, or the like) for causing the light source 2 to operate has the same frequency as the pulse frequency of the pulse light. The control signal for causing the light source 2 to operate can therefore be used as the reference signal inputted to the signal extractor 8. When a laser light source using a passive Q-switch, a laser light source using a mode-lock method, or the like is used as the light source 2, there is no need to send a control signal for frequency modulation to the light source 2. In this case, a portion of the pulse light emitted from the light source 2 may be received by a photodiode, and an electrical signal generated by this light reception may be used as a reference signal to be inputted to the signal extractor 8.

As illustrated in FIG. 2, various noise is included in the detection signal S1 transmitted from the detector 7 to the signal extractor 8. However, it is highly likely that a signal having a frequency corresponding to the pulse frequency of the pulse light L in the detection signal S1 is a signal generated as a result of reception of the pulsed electron beam B by the sample T. In other words, in the detection signal S1, a signal having a frequency corresponding to the pulse frequency of the pulse light L can be considered to be a signal indicating a state (structure, shape, material, etc.) of a region (region of the sample T) irradiated by the pulsed electron beam, and can be considered to be a signal from which noise is removed.

In the first embodiment, there is no need to dispose a blanking electrode and a blanking slit between the photocathode and the sample T. The electron beam emitted from the photocathode 3 is therefore effectively utilized. However, when a blanking slit is used, the drawback arises that there is a significant decrease in the amount of electrons from before to after passage thereof through the blanking slit. The problem also arises that misalignment occurs at the irradiation position of the electron beam as the blanking electrode is controlled at high speed.

In addition to the effect described above, the sample inspection device 1A according to the first embodiment synergistically exhibits the three effects described below.

A first effect is that by radiating an electron beam B to the sample T to inspect the sample, a diameter of an inspection spot can be reduced in size relative to a case in which the sample is inspected by light irradiation. In other words, by radiating an electron beam to the sample T to inspect the sample, the state (structure, shape, material, etc.) of a more minute region can be inspected.

A second effect is that through use of the photocathode 3 as the electron beam source, a high-intensity electron beam B can be generated. For example, it is assumed that the sample T is scanned using an electron beam. In the first embodiment, a high-intensity electron beam can be generated, and minute defects and the like in the sample T can therefore be detected even when a scanning speed is increased. When a spot diameter of the electron beam is decreased in size to inspect a minute region, the time taken to scan the sample T using the electron beam increases. When the photocathode 3 is used as the electron beam source, the intensity of the electron beam is increased by at least several times (e.g., at least 10 times) relative to a case in which another electron beam source is used. A sample can therefore be inspected in a shorter time despite the small spot diameter of the electron beam. A semiconductor photocathode has higher quantum efficiency than a metal photocathode, and adequate excitation is therefore obtained even by light having a relatively low peak power, as in the case of a semiconductor laser (or an LED). A degree of freedom in selection of a unit waveform of the frequency-modulated light radiated to the photocathode 3 is therefore increased when a semiconductor photocathode is used as the photocathode 3. For example, when frequency-modulated light having a sine waveform is used as the frequency-modulated light, noise removal characteristics of the signal extractor 8 (e.g., the lock-in amplifier) are enhanced relative to a case in which pulse light having a rectangular waveform is used. When a semiconductor laser (or an LED) is used as the light source 2, the modulation frequency of the frequency-modulated light can be freely selected. Therefore, by employing a frequency different from a known noise frequency as the modulation frequency of the frequency-modulated light emitted from the light source 2, the noise removal characteristics of the signal extractor 8 (e.g., the lock-in amplifier) can be further enhanced. When a mode-lock laser or a passive Q-switch laser is used as the light source 2, it is difficult to freely select the modulation frequency of the frequency-modulated light.

A third effect is that by extracting a signal having a frequency corresponding to the pulse frequency of the pulse light L from within the detection signal generated by the detector 7, a noise component included in the detection signal can be effectively removed. When the detection signal is used without modification as a sample inspection result, a time of inspection (time of electron beam irradiation) at each inspection spot must be increased to enhance a S/N ratio of the detection signal. The first embodiment is provided with the signal extractor 8 for extracting a signal having a frequency corresponding to the pulse frequency of the pulse light from within the detection signal S1. Therefore, even when a signal indicating a state (structure, shape, material, etc.) of the sample is faint relative to noise, the signal indicating a state of the sample can be effectively extracted from within the noise. There is thereby no need to increase the time of inspection at each inspection spot to enhance the S/N ratio of the detection signal, and the electron beam scanning speed can be increased.

In the first embodiment, the problem caused by the small spot diameter of the electron beam is solved by the synergistic effect of enhancing electron beam intensity through use of the photocathode 3 and reducing noise through use of the signal extractor 8, which are innovative ways of enabling increased speed of sample inspection.

When a sample that is susceptible to damage by the electron beam B is inspected, an acceleration voltage (voltage applied between the anode 4 and the cathode (including the photocathode 3)) of the electron beam B must be suppressed. In this case, the S/N ratio decreases due to such effects as decreased efficiency of generation of secondary electrons emitted from the sample T. In the first embodiment, however, the problem of decreased S/N ratio can be overcome by extracting a signal having a frequency corresponding to the frequency of the pulse light from within a detection signal having a low S/N ratio. Specifically, when the sample inspection device 1A according to the first embodiment is used, high-precision inspection is possible even for a sample which was difficult to inspect conventionally via an electron beam B, i.e., a sample which is susceptible to damage by an electron beam.

From the perspective of increasing the scanning speed of the electron beam B, the pulse frequency of the pulse light L emitted from the light source 2 is preferably 50 MHz or greater, 100 MHz or greater, or 150 MHz or greater, for example. By adopting a high pulse frequency, a large number of pulsed electron beams can be radiated to the sample in a short time. As a result, it is possible for the signal extractor 8 to extract a signal having a frequency corresponding to the frequency of the reference signal S2 from a detection signal S1 acquired in a short time. The modulation frequency is also preferably 50 MHz or greater, 100 MHz or greater, or 150 MHz or greater.

The sample inspection device 1A according to the first embodiment may be a device for detecting a defect in a sample, or a microscope for visualizing a fine structure of a sample.

Embodiment 2

Figure 3:
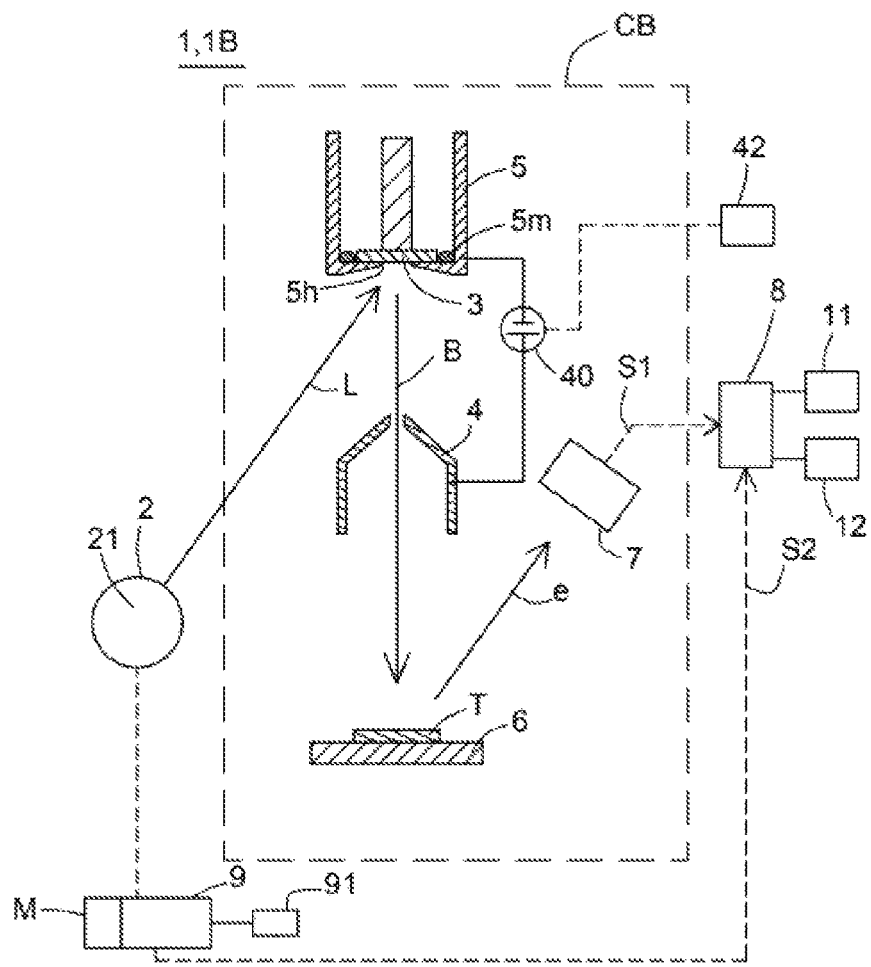
FIG. 3 is a schematic view illustrating an example of a sample inspection device according to a second embodiment.
Figure 6:
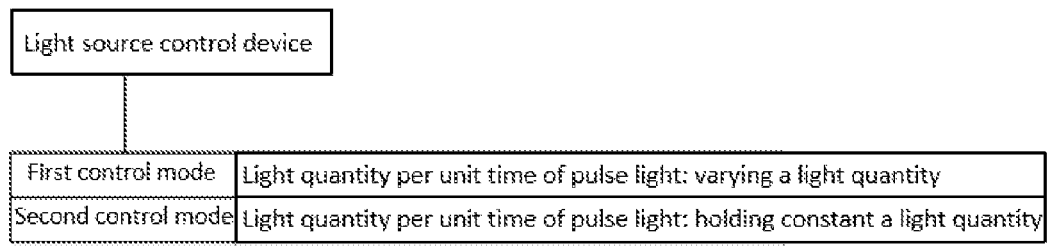
FIG. 6 is a schematic view illustrating a manner in which a light source control device can selectively execute a first control mode for varying a light quantity per unit time of pulse light emitted from a pulse light source, and a second control mode for holding constant the light quantity per unit time of pulse light emitted from the pulse light source.
Figure 7:
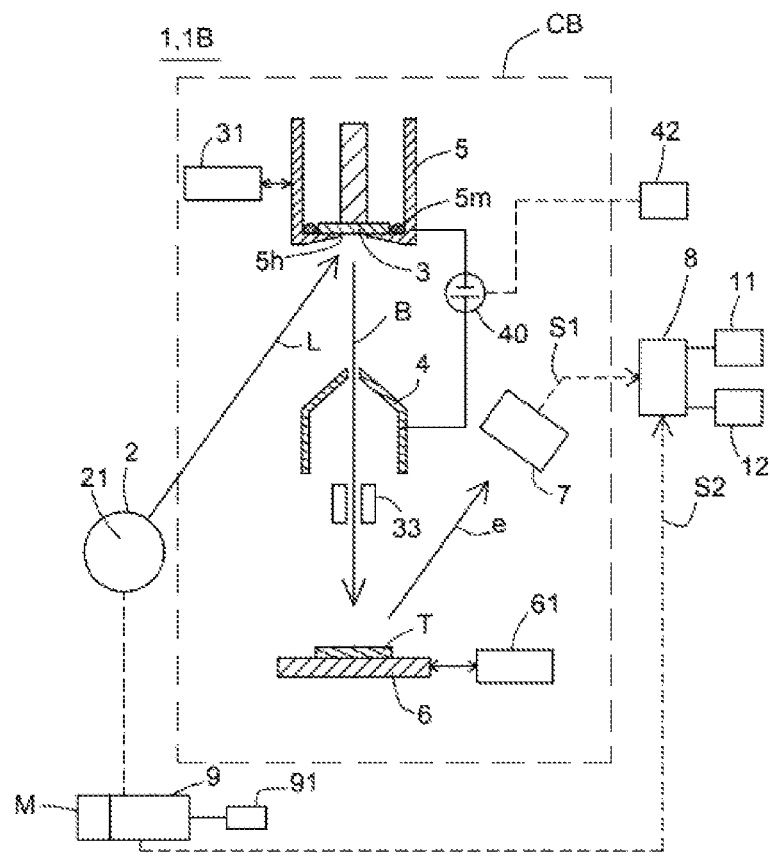
FIG. 7 is a schematic view of an example of a sample inspection device according to a second embodiment.

A sample inspection device 1B according to a second embodiment is described below with reference to FIGS. 3 through 7. FIG. 3 is a schematic view illustrating the sample inspection device 1B according to the second embodiment. FIG. 4A is a diagram for describing a pulse amplitude PA, a pulse width PW, and a pulse interval PI. FIG. 4B is a diagram for describing an amplitude ZA of the frequency-modulated light, and a time interval ZW between two maximum amplitudes of the frequency-modulated light. FIG. 5 is a schematic view illustrating the manner in which a sample type and a plurality of control parameter values are associated and stored. FIG. 6 is a schematic view illustrating the manner in which a light source control device 9 can selectively execute a first control mode for varying a light quantity per unit time of the pulse light L emitted from the light source 2, and a second control mode for holding constant the light quantity per unit time of pulse light emitted from the light source 2. FIG. 7 is a schematic view of an example of the sample inspection device 1B according to the second embodiment.

The sample inspection device 1B according to the second embodiment is provided with a light source 2, a photocathode 3, a detector 7, and a signal extractor 8. The sample inspection device 1B according to the second embodiment may be provided with at least one of a vacuum chamber CB, an anode 4, a photocathode accommodating vessel 5, and a sample stage 6. The light source 2, photocathode 3, anode 4, photocathode accommodating vessel 5, sample stage 6, detector 7, signal extractor 8, and vacuum chamber CB in the second embodiment are the same as the light source 2, photocathode 3, anode 4, photocathode accommodating vessel 5, sample stage 6, detector 7, signal extractor 8, and vacuum chamber CB in the first embodiment, and repeated description of the structure thereof is therefore omitted.

In the example illustrated in FIG. 3, the sample inspection device 1B is provided with a light source control device 9 for controlling operation of the light source 2.

The light source control device 9 controls the light source 2 in accordance with a control parameter value. The control parameter value includes at least one of a pulse amplitude control parameter value, a pulse width control parameter value, a parameter value for prescribing a unit pulse waveform (e.g., a parameter value for prescribing a rectangular wave, a sine wave, a sawtooth wave, a Gaussian waveform, or the like), and a pulse interval control parameter value. The control parameter value may include at least two, three, or all of a pulse amplitude control parameter value, a pulse width control parameter value, a parameter value for prescribing a pulse waveform, and a pulse interval control parameter value. As indicated in FIG. 4A, the pulse amplitude PA means the maximum value of the intensity of the pulse light, the pulse width PW means an ON time (i.e., the duration of a luminescent state of the pulse light) of a pulse, and the pulse interval PI means an OFF time (i.e., the duration of a non-luminescent state of the pulse light) of a pulse.

When the light emitted from the light source 2 is frequency-modulated light other than pulse light, the "pulse amplitude control parameter value," the "pulse width control parameter value," and the "parameter value for prescribing a unit pulse waveform" shall be replaced with "frequency-modulated light amplitude control parameter value," "control parameter value for prescribing the time interval between two maximum amplitudes of the frequency-modulated light," and "parameter value for prescribing a unit waveform of the frequency-modulated light," respectively. An example of the "amplitude (ZA) of the frequency-modulated light" and the "time interval (ZW) between two maximum amplitudes of the frequency-modulated light" is presented in FIG. 4B.

The light source control device 9 controls the light source in accordance with the pulse amplitude control parameter value, and the light source 2 thereby emits pulse light having a desired pulse amplitude. The light source control device 9 also controls the light source 2 in accordance with the pulse width control parameter value, and the light source 2 thereby emits pulse light having a desired pulse width. The light source control device 9 also controls the light source 2 in accordance with the pulse interval control parameter value, and the light source 2 thereby emits pulse light having a desired pulse interval.

In the second embodiment, when the sample inspection device 1B is provided with the light source control device 9, the waveform (e.g., the pulse amplitude, pulse width, pulse interval, unit pulse waveform, and pulse frequency) of the pulse light L can be adjusted in accordance with the type of sample T.

First Example of a Procedure for Adjusting the Pulse Light Waveform

A first example of a procedure for adjusting the waveform of the pulse light will be described. In the example illustrated in FIG. 3, the sample inspection device 1B is provided with a storage device M (ROM, RAM, hard disk, or the like) for storing first associated data DA in which the type of sample T and a control parameter value are associated. In the example illustrated in FIG. 5, the storage device M associates and stores a first sample T1 and a plurality of control parameter values. More specifically, the storage device M associates and stores the first sample T1, a pulse amplitude control parameter value VA1, a pulse width control parameter value VW1, and a pulse interval control parameter value VI1. In the example illustrated in FIG. 5, the storage device M associates and stores a second sample T2 and a plurality of control parameter values. More specifically, the storage device M associates and stores the second sample T2, a pulse amplitude control parameter value VA2, a pulse width control parameter value VW2, and a pulse interval control parameter value VI2.

Assume, for example, a case in which the first sample T1 is a material more susceptible to damage by an electron beam than the second sample T2. In this case, the pulse amplitude control parameter value VA1 stored by the storage device M should be made smaller than the pulse amplitude control parameter value VA2 stored by the storage device M. Alternatively, or additionally, the pulse width control parameter value VW1 stored by the storage device M should be made smaller than the pulse width control parameter value VW2 stored by the storage device M. In this case, a weaker pulse light (and a weaker electron beam) is used when inspecting the first sample T1, and a stronger pulse light (and a stronger electron beam) is used when inspecting the second sample T2.

Assume, for example, a case in which the first sample T1 is a material more susceptible to heat damage than the second sample T2. In this case, the pulse width control parameter value VW1 stored by the storage device M should be made smaller than the pulse width control parameter value VW2 stored by the storage device M. Alternatively, or additionally, the pulse interval control parameter value VI1 stored by the storage device M should be made larger than the pulse interval control parameter value VI2 stored by the storage device M. In this case, accumulation of heat in the sample is more suppressed during inspection of the first sample T1 than during inspection of the second sample T2.

For manual inputting of the type of sample T, the sample inspection device 1B is preferably provided with an input device 91 for receiving inputting of the sample type. When a user inputs a sample type via the input device 91, the light source control device 9 extracts a control parameter value corresponding to the inputted sample type on the basis of the first associated data stored in the storage device M. The light source control device 9 then controls operation of the light source 2 using the extracted control parameter value.

Alternatively, the type of sample T may be automatically specified. In this case, the sample inspection device 1B is provided with a camera or other sample recognition device for specifying the sample type. The light source control device 9 extracts a control parameter value corresponding to the specified sample type on the basis of information relating to the sample type specified by the sample recognition device and the first associated data stored in the storage device M. The light source control device 9 then controls operation of the light source 2 using the extracted control parameter value.

Second Example of a Procedure for Adjusting the Pulse Light Waveform

A second example of a procedure for adjusting the waveform of the pulse light will be described. In the example illustrated in FIG. 6, the light source control device 9 can selectively execute a first control mode for varying a light quantity per unit time of the pulse light L emitted from the light source 2, and a second control mode for holding constant the light quantity per unit time of pulse light emitted from the light source 2.

In the first control mode, durability of the sample T to the electron beam B can be inspected. In this durability inspection, a sample of the sample T, for example, is used.

In the first control mode, a case is assumed in which the light quantity per unit time of the pulse light is gradually increased. In the first control mode, the light quantity per unit time of the pulse light is increased until the sample T is damaged by the electron beam B. The presence/absence of damage to the sample T is determined by image analysis, for example.

As a result of determination, the sample T is not damaged when the light quantity per unit time of the pulse light is equal to or less than a first threshold value Th1, and the sample T is damaged when the light quantity per unit time of the pulse light is greater than a second threshold value Th2.

In the case described above, during inspection of an actual product (e.g., an actual marketed product) using the sample inspection device 1B, the light quantity per unit time of the pulse light is set so as to be equal to or less than the first threshold value Th1. The first threshold value Th1 and the second threshold value Th2 may be the same value, but when there is a range in which the presence/absence of damage to the sample T is unclear, the first threshold value Th1 and the second threshold value Th2 may be different values, respectively.

In the second control mode, a sample (e.g., an actual product) can be inspected without damaging the sample T.

In the second control mode, the light quantity per unit time of the pulse light is held constant. From the perspective of suppressing damage to the sample T, the light quantity per unit time of the pulse light in the second control mode is maintained so as to be equal to or less than the first threshold value Th1.

An example was described above in which the light quantity per unit time of the pulse light is gradually increased in the first control mode. Alternatively, the light quantity per unit time of the pulse light may be gradually decreased in the first control mode. When the light quantity per unit time of the pulse light is changed, at least one of the pulse amplitude of the pulse light, the pulse width of the pulse light, and the pulse interval of the pulse light is varied.

In the second embodiment, when the waveform of the pulse light can be adjusted, it is then possible to select a more appropriate pulse waveform for a characteristic of the sample. For example, by selecting the maximum intensity in a range in which the sample is not damaged by the intensity of the pulse light (e.g., the intensity of the electron beam), the speed of inspection of the sample T can be increased.

Voltage Applied Between the Anode 4 and the Photocathode 3

In the example illustrated in FIG. 3, the sample inspection device 1B is provided with a power source 40 for applying a voltage between the anode 4 and the photocathode 3 (more specifically, a cathode including the photocathode 3), and a voltage control device 42 for controlling a magnitude of the voltage applied between the anode 4 and the photocathode 3.

When the voltage applied between the anode 4 and the photocathode 3 is large, the electron beam B can reach a deeper region of the sample T. In other words, inspection of the sample T can extend to a deeper region thereof. Meanwhile, when the voltage applied between the anode 4 and the photocathode 3 is small, a surface portion of a sample can be prioritized for inspection.

Mechanism of Sample Scanning by the Electron Beam B

Example of a mechanism of sample scanning by the electron beam B is described below with reference to FIG. 7.

As indicated in FIG. 7, the sample inspection device 1B may be provided with a drive device 61 for moving the sample stage 6. In this case, the sample stage 6 is moved, and the sample T is thereby scanned by the electron beam B. A direction in which the sample stage 6 is moved by the drive device 61 is parallel to an inspection surface of the sample T, for example.

Alternatively, or additionally, the sample inspection device 1B may be provided with a drive device 31 for moving the photocathode 3. In this case, the photocathode 3 is moved, and the sample T is thereby scanned by the electron beam B. A direction in which the photocathode 3 is moved by the drive device 31 is parallel to the inspection surface of the sample T, for example.

Alternatively, or additionally, the sample inspection device 1B may be provided with an electron beam deflection device 33 for bending the electron beam emitted from the photocathode 3. In this case, the electron beam B emitted from the photocathode 3 is deflected, and the sample T is thereby scanned by the electron beam B. The electron beam deflection device 33 includes a deflecting electrode for generating an electric field in a direction intersecting with a direction of travel of the electron beam B, for example.

Recording or Display of Inspection Results

As indicated in FIG. 3, the sample inspection device 1B may be provided with a storage device 11 for recording the signal extracted by the signal extractor 8, and/or a display device 12 for visually displaying the signal extracted by the signal extractor 8. The storage device 11 may be configured to associate and record a position of irradiation in the sample T by the electron beam B and the signal extracted by the signal extractor 8. In this case, by referring to a relationship between the irradiation position and the intensity of the signal extracted by the signal extractor 8, the position of a defect in the sample T can be identified. The display device 12 may also associate and display the position of irradiation in the sample T by the electron beam B and the signal extracted by the signal extractor 8.

Sample Inspection Method

Figure 8:
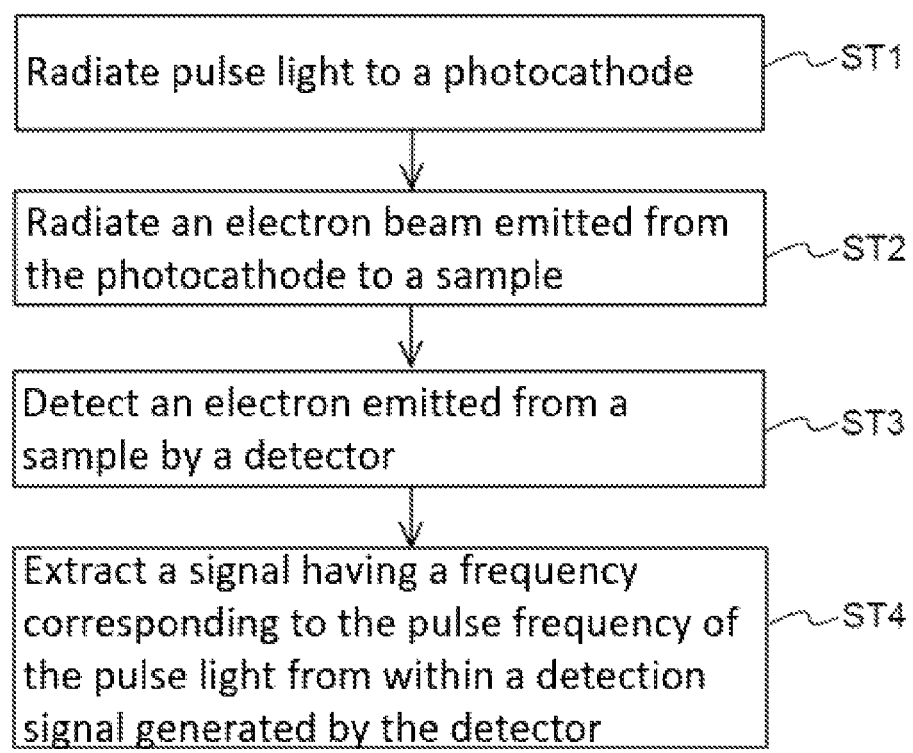
FIG. 8 is a flowchart illustrating an example of a sample inspection method according to an embodiment.

An example of a sample inspection method according to an embodiment is described below with reference to FIG. 8. FIG. 8 is a flowchart illustrating an example of the sample inspection method according to an embodiment of the present invention.

The sample inspection method according to an embodiment of the present invention may be executed using the sample inspection device 1A of the first embodiment or the sample inspection device 1B of the second embodiment, or executed using another sample inspection device.

In a first step ST1, the pulse light L is radiated to the photocathode 3. In other words, the first step ST1 is a pulse light irradiation step.

The pulse frequency of the pulse light L may be modified prior to the first step ST1 in accordance with the type of the sample T to be inspected. For example, the pulse frequency of the pulse light may be set to a first frequency F1 when the sample T is the first sample T1, and the pulse frequency of the pulse light may be set to a second frequency F2 different from the first frequency when the sample T is the second sample T2.

The control parameter value (e.g., at least one control parameter value from among the pulse amplitude control parameter value, the pulse width control parameter value, the parameter value for prescribing a unit pulse waveform, and the pulse interval control parameter value) for controlling operation of the light source 2 may also be modified prior to the first step ST1 in accordance with the type of the sample T to be inspected. For example, when the sample T is the first sample T1, the pulse amplitude control parameter value, the pulse width control parameter value, and the pulse interval control parameter value may be set to a value VA1, a value VW1, and a value VI1, respectively, and when the sample T is the second sample T2, the pulse amplitude control parameter value, the pulse width control parameter value, and the pulse interval control parameter value may be set to a value VA2, a value VW2, and a value VI2, respectively.

The voltage applied between the anode 4 and the photocathode 3 (more specifically, the cathode including the photocathode 3) may also be modified prior to the first step ST1 in accordance with the type of the sample T to be inspected. For example, when the sample T is the first sample T1, the voltage applied between the anode 4 and the photocathode 3 may be set to a voltage V1, and when the sample T is the second sample T2, the voltage applied between the anode 4 and the photocathode 3 may be set to a voltage V2 different from the voltage V1.

In a second step ST2, the electron beam B emitted from the photocathode 3 is radiated to the sample T. In other words, the second step ST2 is an electron beam irradiation step.

Emission of the electron beam B from the photocathode 3 in the second step ST2 is a phenomenon caused by irradiation of the photocathode 3 by the pulse light. Therefore, when the pulse frequency of the pulse light radiated to the photocathode 3 is the first frequency F1, the electron beam B is a pulsed electron beam in which a frequency of variation in the amount of electrons thereof is the first frequency F1.

In a third step ST3, reflected electrons and secondary electrons emitted from the sample T, or transmitted electrons, are detected by the detector 7. In other words, the third step ST3 is a detection step for detecting electrons. In the case of detecting reflected electrons or secondary electrons emitted from the sample T, the detector 7 is disposed on the same side of the sample T as the photocathode 3. In the case of detecting transmitted electrons emitted from the sample T, the detector 7 is disposed on the opposite side of the sample T from the photocathode 3.

Emission of electrons (reflected electrons and secondary electrons, or transmitted electrons) from the sample T in the third step ST3 is a phenomenon caused by irradiation of the sample T by the electron beam B. Therefore, when the pulse frequency of variation in the amount of electrons in the electron beam B radiated to the sample T is the first frequency F1, a signal SA (see FIG. 2) having the first frequency F1 in the detection signal generated by the detector 7 can be considered to be a signal (non-noise signal) generated as a result of irradiation by the electron beam B.

In a fourth step ST4, a signal having a frequency corresponding to the pulse frequency of the pulse light L is extracted from within the detection signal generated by the detector 7. In other words, the fourth step ST4 is a signal extraction step.

Signal extraction in the fourth step ST4 is performed using a lock-in amplifier or other signal extractor 8. More specifically, when the pulse frequency of the pulse light emitted by the light source 2 is the first frequency F1, a signal SA having the first frequency F1 is extracted from within the detection signal S1 generated by the detector 7, for example.

Durability Inspection Step

A sample inspection step is constituted from the pulse light irradiation step, the electron beam irradiation step, the detection step, and the signal extraction step described above. A durability inspection step for inspecting durability of the sample T or a sample of the same type as the sample T may be performed prior to the sample inspection step. In the durability inspection step, the sample T (or a sample T' of the same type as the sample T) is inspected for durability to an electron beam.

An example of the durability inspection step will be more specifically described. In the durability inspection step, the light quantity per unit time of the pulse light emitted from the light source 2 is varied. A relationship between the light quantity per unit time of the pulse light L emitted from the light source 2 and damage to the sample T (or the sample T' of the same type as the sample T) is determined. This relationship is, for example that the sample T (or the sample T' of the same type as the sample T) is not damaged when the light quantity per unit time of the pulse light is equal to or less than a first threshold value Th1, and the sample T (or the sample T' of the same type as the sample T) is damaged when the light quantity per unit time of the pulse light is greater than a second threshold value Th2.

A control parameter value for the light source 2 to be used in the sample inspection step is determined in accordance with an inspection result of the durability inspection step. For example, a control parameter value (pulse amplitude control parameter value, pulse width control parameter value, pulse interval control parameter value, etc.) is determined so that the light quantity per unit time of the pulse light emitted from the light source 2 is equal to or less than the first threshold value Th1. Control parameters are preferably determined so that the light quantity per unit time of the pulse light emitted from the light source 2 is equal to or less than the first threshold value Th1 and is close to the first threshold value Th1.

When the sample inspection method according to an embodiment of the present invention is provided with the durability inspection step, the intensity of the electron beam radiated to the sample can be optimized in accordance with the durability of the sample.

Method for Inspecting a Layered Body

Figure 9:
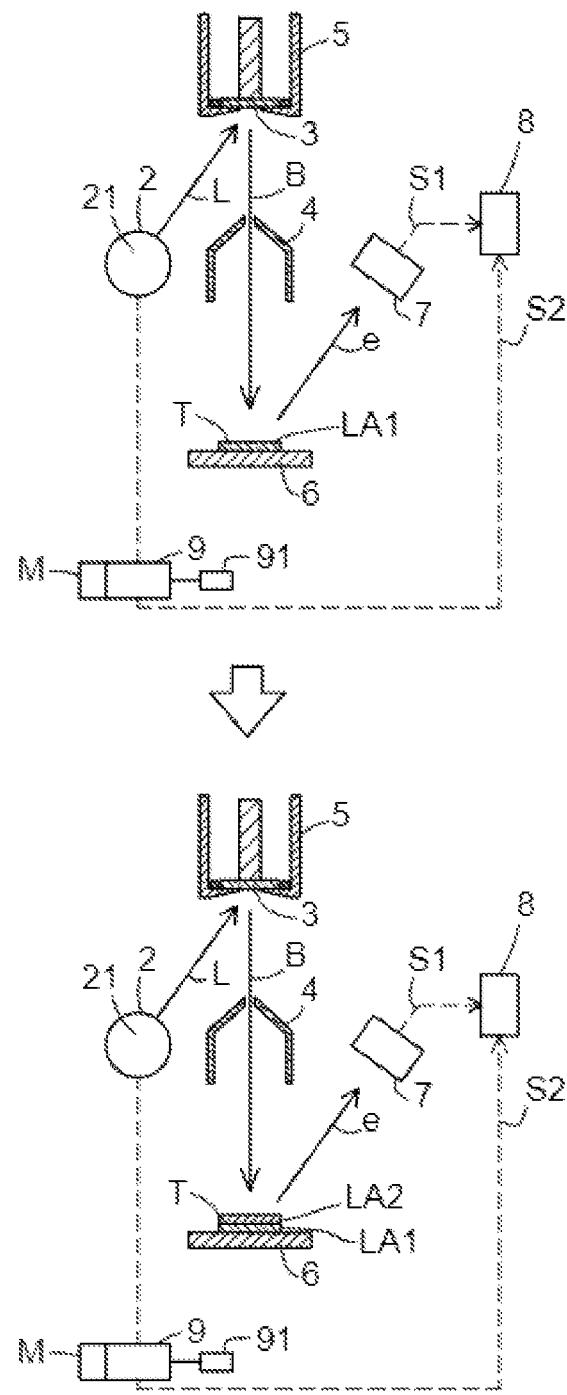
FIG. 9 is a schematic view illustrating a method for inspecting a sample that is a layered body.

A method for inspecting a sample T that is a layered body will be described with reference to FIG. 9. In the example illustrated in FIG. 9, a first layer LA1 of the sample T is inspected, and a second layer LA2 layered on the first layer LA1 is subsequently inspected.

A first layer inspection step for inspecting the first layer LA1 of the sample T includes the pulse light irradiation step, the electron beam irradiation step, the detection step, and the signal extraction step described above. In the electron beam irradiation step in the first layer inspection step, the electron beam B is radiated to the first layer LA1.

After the first layer inspection step, the second layer LA2 is layered over the first layer LA1. The first layer LA1 is thereby covered by the second layer LA2. The second layer LA2 is layered directly on the first layer LA1 in the example illustrated in FIG. 9, but the second layer LA2 may also be layered on the first layer LA1 on top of another layer.

A second layer inspection step for inspecting the second layer LA2 of the sample T includes the pulse light irradiation step, the electron beam irradiation step, the detection step, and the signal extraction step described above. In the electron beam irradiation step in the second layer inspection step, the electron beam B is radiated to the second layer LA2 so that the electron beam B does not reach the first layer LA1; in other words, so that the electron beam B essentially does not reach the first layer LA1. More specifically, the voltage applied between the anode 4 and the photocathode 3 (more specifically, the cathode including the photocathode 3) is set, for example, so that the electron beam B does not reach the first layer LA1. Alternatively, or additionally, when the sample inspection device is an electron microscope, a focus or other characteristic of an electron lens system may be set so that the electron beam B does not reach the first layer LA1.

When the electron beam is radiated to the second layer so that the electron beam does not reach the first layer, emission of electrons from the first layer LA1 is suppressed during inspection of the second layer LA2. The state of the second layer LA2 can therefore be more accurately inspected.

The present invention is not limited to the embodiments described above, and it is clear that the embodiments can be appropriately modified or changed within the range of the technical idea of the present invention. Any of the constituent elements used in the embodiments can also be incorporated into another embodiment, and any of the constituent elements of the embodiments can also be omitted.

For example, in the examples described above, an electron beam is radiated to a sample using a single light source 2 and a single photocathode 3. Alternatively, it is possible to prepare a plurality of sets comprising a light source 2 and a photocathode 3, and also to cause the frequency-modulated light to have a different frequency for each light source 2. For example, frequency-modulated light having a first frequency is radiated from a first light source to a first photocathode, and a first electron beam is radiated from the first photocathode to a first portion of a sample. At the same time, frequency-modulated light having a second frequency is radiated from a second light source to a second photocathode, and a second electron beam is radiated from the second photocathode to a second portion of the sample. Electrons reflected by the first portion (or transmitted through the first portion) are then received by the detector 7, and electrons reflected by the second portion (or transmitted through the second portion) are received by the detector 7. A detection signal corresponding to the first frequency and a detection signal corresponding to the second frequency are subsequently extracted by the signal extractor 8. In this manner, the first portion and the second portion can be inspected simultaneously. Through simultaneous inspection of a first portion and a second portion, the time taken to inspect a sample can be shortened. A configuration may be adopted in which the frequency of the frequency-modulated light is not varied for each light source 2; for example, the frequency of the frequency-modulated light radiated from first and second light sources 2 may be the same. In this case, because detection signals corresponding to the same frequency from a single detector 7 cannot be differentiated, the number of detectors 7 provided should be the same as the number of light sources 2.

In place of the example described above of preparing a plurality of sets comprising the light source 2 and the photocathode 3, a set comprising a single photocathode 3 and a plurality of light sources 2 may be prepared. When the photocathode 3 receives frequency-modulated light radiated from the light sources 2, the photocathode 3 can emit an electron beam B. Consequently, by causing the photocathode 3 for receiving the frequency-modulated light radiated from the plurality of light sources 2 to have different regions, despite there being a single photocathode 3, the same effect is obtained as in the abovementioned example in which a plurality of sets comprising a light source 2 and a photocathode 3 are prepared. A plurality of sets of a single photocathode 3 and a plurality of light sources 2 may also be prepared.

INDUSTRIAL APPLICABILITY

Through use of the sample inspection device and sample inspection method of the present invention, noise is removed from a detection signal, and a generated electron beam is utilized effectively for inspection. The present invention is therefore useful to a manufacturer of a sample inspection device, and to an inspector of a sample using the sample inspection device and the sample inspection method.

REFERENCE SIGNS LIST 1, 1A, 1B: sample inspection device
2: light source
3: photocathode
4: anode
5: photocathode accommodating vessel
5h: electron beam passage hole
5m: treatment material
6: sample stage
7: detector
8: signal extractor
9: light source control device
11: storage device
12: display device
21: electro-optic element
31: drive device
33: electron beam deflection device
40: power source
42: voltage control device
61: drive device
91: input device
B: electron beam
CB: vacuum chamber
DA: first associated data
L: pulse light
LA1: first layer
LA2: second layer
M: storage device
PA: pulse amplitude
PI: pulse interval
PW: pulse width
S1: detection signal
S2: reference signal
SA: signal
T, T': sample
T1: first sample
T2: second sample
VA1, VA2: pulse amplitude control parameter value
VI1, VI2: pulse interval control parameter value
VW1, VW2: pulse width control parameter value
ZA: amplitude of frequency-modulated light
ZW: time interval between two maximum amplitudes of frequency-modulated light
e: electrons

The invention claimed is:

1. A sample inspection device, comprising:
a light source for emitting frequency-modulated light;
a photocathode for emitting an electron beam in response to receiving said frequency-modulated light;
a detector for detecting an electron emitted from a sample irradiated by said electron beam and generating a detection signal; and
a signal extractor for extracting a signal having a frequency corresponding to a modulation frequency of said frequency modulated light from within said detection signal, to enhance the inspection of the sample.

2. The sample inspection device of claim 1, wherein:
said signal extractor includes a lock-in amplifier;
said lock-in amplifier receives said detection signal and a reference signal; and
said lock-in amplifier extracts a signal having a frequency corresponding to a frequency of said reference signal from within said detection signal.

3. The sample inspection device of claim 1, further comprising:
a light source control device for controlling operation of said light source in accordance with a control parameter value; and
a storage device for storing first associated data in which a type of said sample and said control parameter value are associated;
said control parameter value including at least one of an amplitude control parameter value or a pulse amplitude control parameter value of said frequency-modulated light, a pulse width control parameter value or a control parameter value for prescribing a time interval between two maximum amplitudes of said frequency-modulated light, a parameter value for prescribing a unit waveform or a parameter value for prescribing a unit pulse waveform of said frequency-modulated light, and a pulse interval control parameter value.

4. The sample inspection device of claim 1, further comprising:
a light source control device for controlling operation of said light source;
said light source control device being capable of selectively executing a first control mode for varying a light quantity per unit time of said frequency-modulated light emitted from said light source, and a second control mode for holding constant the light quantity per unit time of said frequency-modulated light emitted from said light source.

5. A sample inspection method comprising:
a light irradiation step for radiating frequency-modulated light to a photocathode;
an electron beam irradiation step for radiating an electron beam emitted from said photocathode to a sample;

a detection step for detecting, through use of a detector, an electron emitted from said sample; and a signal extraction step for extracting a signal having a frequency corresponding to a modulation frequency of said frequency-modulated light from within a detection signal generated by said detector, to enhance the inspection of the sample.

6. The sample inspection method of claim 5, further comprising:

a step for changing, in accordance with the type of said sample, at least one of an amplitude of said frequency-modulated light or a pulse amplitude of said frequency-modulated light, a time interval between two maximum amplitudes of said frequency-modulated light or a pulse width of said frequency-modulated light, a unit waveform of said frequency-modulated light, and a pulse interval of said frequency-modulated light.

7. The sample inspection method of claim 5, comprising:

a sample inspection step including said light irradiation step, said electron beam irradiation step, said detection step, and said signal extraction step; and a durability inspection step executed prior to said sample inspection step;

said durability inspection step including inspecting durability of said sample to said electron beam, or inspecting durability of a sample of the same type as said sample to said electron beam; and a control parameter value of a light source used in said sample inspection step being determined in accordance with an inspection result of said durability inspection step.

8. The sample inspection method of claim 6, comprising:

a sample inspection step including said light irradiation step, said electron beam irradiation step, said detection step, and said signal extraction step; and a durability inspection step executed prior to said sample inspection step;

said durability inspection step including inspecting durability of said sample to said electron beam, or inspecting durability of a sample of the same type as said sample to said electron beam; and a control parameter value of a light source used in said sample inspection step being determined in accordance with an inspection result of said durability inspection step.

9. The sample inspection method of claim 5, comprising:

a first layer inspection step for inspecting a first layer of said sample; and a second layer inspection step for inspecting a second layer of said sample after said second layer is layered over said first layer;

each of said first layer inspection step and said second layer inspection step including said light irradiation step, said electron beam irradiation step, said detection step, and said signal extraction step; and said electron beam being radiated to said second layer so that said electron beam does not reach said first layer in said second layer inspection step.

10. The sample inspection device of claim 2, further comprising:

a light source control device for controlling operation of said light source in accordance with a control parameter value; and a storage device for storing first associated data in which a type of said sample and said control parameter value are associated;

said control parameter value including at least one of an amplitude control parameter value or a pulse amplitude control parameter value of said frequency-modulated light, a pulse width control parameter value or a control parameter value for prescribing a time interval between two maximum amplitudes of said frequency-modulated light, a parameter value for prescribing a unit waveform or a parameter value for prescribing a unit pulse waveform of said frequency-modulated light, and a pulse interval control parameter value.

11. The sample inspection device of claim 2, further comprising:

a light source control device for controlling operation of said light source;

said light source control device being capable of selectively executing a first control mode for varying a light quantity per unit time of said frequency-modulated light emitted from said light source, and a second control mode for holding constant the light quantity per unit time of said frequency-modulated light emitted from said light source.

12. The sample inspection method of claim 6, comprising:

a first layer inspection step for inspecting a first layer of said sample; and a second layer inspection step for inspecting a second layer of said sample after said second layer is layered over said first layer;

each of said first layer inspection step and said second layer inspection step including said light irradiation step, said electron beam irradiation step, said detection step, and said signal extraction step; and said electron beam being radiated to said second layer so that said electron beam does not reach said first layer in said second layer inspection step.

13. The sample inspection method of claim 7, comprising:

a first layer inspection step for inspecting a first layer of said sample; and a second layer inspection step for inspecting a second layer of said sample after said second layer is layered over said first layer;

each of said first layer inspection step and said second layer inspection step including said light irradiation step, said electron beam irradiation step, said detection step, and said signal extraction step; and said electron beam being radiated to said second layer so that said electron beam does not reach said first layer in said second layer inspection step.

14. The sample inspection method of claim 8, comprising:

a first layer inspection step for inspecting a first layer of said sample; and a second layer inspection step for inspecting a second layer of said sample after said second layer is layered over said first layer;

each of said first layer inspection step and said second layer inspection step including said light irradiation step, said electron beam irradiation step, said detection step, and said signal extraction step; and said electron beam being radiated to said second layer so that said electron beam does not reach said first layer in said second layer inspection step.

15. A sample inspection device, comprising:

a light source for emitting frequency-modulated light;

a photocathode for emitting an electron beam in response to receiving said frequency-modulated light;

a detector for detecting an electron emitted from a sample irradiated by said electron beam and generating a detection signal;

a signal extractor for extracting a signal having a frequency corresponding to a modulation frequency of said frequency-modulated light from within said detection signal; and a storage device for recording the signal extracted by the signal extractor, configured to associate and record a position of irradiation in the sample by the electron beam with the signal extracted by the signal extractor, and for providing a relationship between the position of irradiation and an intensity of the signal extracted by the signal extractor for identifying a position of a defect on the sample.

* * * * *